United States Patent
Egashira

[11] Patent Number: 5,902,134
[45] Date of Patent: May 11, 1999

[54] DRY ETCHING POST-TREATMENT METHOD AND METHOD FOR MANUFACTURING A SEMICONDUCTOR DEVICE

[75] Inventor: Kyoko Egashira, Kyoto, Japan

[73] Assignee: Matsushita Electronics Corporation, Japan

[21] Appl. No.: 08/905,736

[22] Filed: Aug. 4, 1997

[30] Foreign Application Priority Data

Aug. 7, 1996 [JP] Japan .................................... 8-208018
Oct. 30, 1996 [JP] Japan .................................... 8-287719

[51] Int. Cl.$^6$ .................................................. H01L 21/00
[52] U.S. Cl. ......................... 438/723; 438/725; 438/743; 216/67; 216/79
[58] Field of Search ............................... 134/1.2, 1.3, 31; 216/67, 79; 438/715, 719, 723, 724, 725, 743, 744, 735

[56] References Cited

U.S. PATENT DOCUMENTS

| | | | |
|---|---|---|---|
| 4,818,334 | 4/1989 | Shwartzman et al. | 438/720 |
| 5,226,056 | 7/1993 | Kikuchi et al. | 373/18 |
| 5,306,671 | 4/1994 | Ogawa et al. | |
| 5,445,712 | 8/1995 | Yanagida | 156/662 |

FOREIGN PATENT DOCUMENTS

| | | |
|---|---|---|
| 0 305 946 A2 | 3/1989 | European Pat. Off. |
| 0 305 946 A3 | 3/1989 | European Pat. Off. |
| 0 536 968 A2 | 4/1993 | European Pat. Off. |
| 0 690 486 A2 | 1/1996 | European Pat. Off. |
| 0 690 486 A3 | 1/1996 | European Pat. Off. |

OTHER PUBLICATIONS

Zenqi Yu et al.; "Wide–Area Near Afterglow Oxygen Radical Source Used As A Polymer Resist Asher"; vol. 59, No. 10; Sep. 2, 1991, pp. 1194–1196, XP000234539 *p. 1195, col. 1, paragraph 2—col. 2, paragraph 2; figure 2*.

Patent Abstracts of Japan; vol. 018, No. 617 (E–1634), Nov. 24, 1994 & JP 06 236864A (Hitachi Ltd), Aug. 23, 1994 * abstract*.

Zia Hasan et al.; "In Situ Auto Ash: A Key To Reducing Process Generated Particles"; Proceedings of the SPIE; vol. 1593, Sep. 9, 1991, pp. 23–31, XP000195499.

*Primary Examiner*—William Powell
*Attorney, Agent, or Firm*—Parkhurst & Wendel, L.L.P.

[57] ABSTRACT

The present invention has an object of providing a method for manufacturing a semiconductor device wherein an underlying silicon substrate or polycrystalline silicon film is less subject to etching during ashing. A method for manufacturing a semiconductor device according to the present invention comprises the steps of: covering a predetermined portion of an insulating film (2) on the silicon substrate (1) or the polycrystalline silicon film with a photoresist (3); removing a portion of said insulating film (2) not covered with the photoresist by dry etching using an etching gas containing carbon and fluorine; and removing a fluorocarbon film (6) deposited on the surface of the substrate and said photoresist 3 by ashing using at least an oxygen gas while controlling the temperature at 100° C. or lower, wherein the underlying silicon substrate or polycrystalline silicon film is less subject to etching during the ashing.

6 Claims, 8 Drawing Sheets

DRY ETCHING POST-TREATMENT METHOD AND METHOD FOR MANUFACTURING A SEMICONDUCTOR DEVICE

FIELD OF THE INVENTION

The present invention relates to a method for manufacturing a semiconductor device prepared by using the dry etching of an insulator device. In addition, the present invention relates to a dry etching post-treatment method executed after the insulator dry etching.

BACKGROUND OF THE INVENTION

Using FIG. 4, one example of conventional pattern forming process for an insulating film formed on a silicon substrate will be described.

As shown in FIG. 4A, after an insulating film 12 such as silicon oxide and/or silicon nitride film is allowed to grow on the silicon substrate 11, a predetermined portion on the insulating film 12 is covered with a photoresist 13.

Then, using a gas mixture of carbon and fluorine, e.g., comprising CF4 and CHF3, as an etching gas, dry etching is applied, thus removing a portion 14 not covered with the photoresist 13 of the insulating film 12.

During the dry etching, a fluorocarbon film 16, a polymer film containing carbon and fluorine, is deposited on the surface of a to-be-treated substrate 15 as shown in FIG. 4B.

Thereafter, the photoresist 13 and the fluorocarbon film 16 is removed by ashing using oxygen gas. At that time, to accelerate the ashing rate, generally, the temperature of the to-be-treated substrate 15 is controlled to be high between 150° C. to 250° C.

As a representative semiconductor device using a side wall film, MOS transistors having a Lightly-Doped Drain (hereinafter, abbreviated as LDD) structure are well known.

One example of conventional LDD formation process will be described referring to FIG. 5.

As shown in FIG. 5A, a gate electrode 18 is formed on the semiconductor silicon substrate 16 via a gate oxide film 17 by the publicly-known photolithography and dry etching techniques and low-concentration diffused layers 19 and 20 serving as part of source and drain are formed with the gate electrode 18 used as mask by means of ion implantation in a self-alignment manner.

Next, as shown in FIG. 5B, a silicon oxide film 22 is allowed to grow in such a manner as to cover the surface of the to-be-treated substrate 21 by the publicly-known CVD technique. Then, using an etching gas containing carbon and fluorine, e.g., a gas mixture of CF4 AND CHF3, as shown in FIG. 5C, an anisotropic dry etching is practiced all over the silicon oxide film 22 in such a manner as to leave only the side face of the gate electrode 18 and thus a side wall film 23 is formed on the side face of the gate electrode 18.

After the formation of the side wall film 23 on the side face of the gate electrode 18, with the gate electrode 18 and the side wall film 23 employed as mask as shown in FIG. 5E, high-concentration diffused layers 24 and 25 serving as the other part of the source and drain are formed in the self-alignment manner by means of ion implantation.

In the process step of forming a MOS transistor of such an LDD structure, as shown in FIG. 5C, a fluorocarbon film 26, a polymer film containing carbon and fluorine, is deposited on the surface of the to-be-treated substrate 21 during the dry etching of the silicon oxide film 22.

For this reason, before the implementation of FIG. 5E after the completion of the process step shown in FIG. 5C, the post-treatment step of removing the fluorocarbon film 26 is carried out as shown in FIG. 5D.

To be specific, from a conventional thinking that the fluorocarbon film 26 can be stripped off by an oxygen plasma method and the semiconductor silicon substrate 16 is not stripped off by the oxygen plasma method, an ordinary oxygen plasma treatment device used for the ashing of a photoresist is employed.

This ordinary oxygen plasma treatment device used for the ashing of a photoresist is so arranged as to control the temperature of a to-be-treated substrate 21 at high temperatures of 150° C. to 250° C., and to remove the photoresist by stripping in an oxygen plasma.

Heretobefore, a description is made of the process step for forming a conventional LDD forming step, but there is another semiconductor device using a side wall film such as MOS transistor with a side wall film utilized for an element separation insulating film.

FIG. 6 shows a conventional example of the process step for forming an element separation insulating film by utilizing a side wall film.

As shown in FIG. 6A, an insulating film 28, constituent part of the insulating film separating a transistor activated region 27 on the semiconductor silicon substrate 16, is formed using publicly-known photolithography and dry etching techniques.

Next, as shown in FIG. 6B, a silicon oxide film 22 is allowed to grow in such a manner as to cover the surface of the to-be-treated substrate 21 by a publicly-known CVD technique. Then, using an etching gas containing carbon and fluorine, e.g., a gas mixture of CF4 AND CHF3, as shown in FIG. 6C, an anisotropic dry etching is practiced all over the silicon oxide film 22 in such a manner as to leave only the side face of the gate electrode 28, and thus a side wall film 23 is formed on the side face of the gate electrode 28.

Thereafter, on the transistor activated region 27 via the gate oxide film 17, as shown in FIG. 6E, a gate electrode 18 is formed using the publicly-known photolithography and dry etching techniques to thus prepare a MOS transistor.

In such a process step of forming a MOS transistor on the element separation insulating film by utilizing a side wall film, as shown in FIG. 6C, a fluorocarbon film 26, or a polymer film containing carbon and fluorine, is deposited on the surface of the to-be-treated substrate 21 during the dry etching of the silicon oxide film 22.

For this reason, before the implementation of FIG. 6E after the completion of the process step shown in FIG. 6C, the post-treatment step for removing the fluorocarbon film 26 to implement an aspect as shown in FIG. 2D becomes necessary. Thus, like the ashing of a fluorocarbon film 26 in the process step of forming a MOS transistor of an LDD structure, an ordinary oxygen plasma treatment device used for the ashing of a photoresist is employed while controlling the temperature of a to-be-treated substrate 21 at high temperatures of 150° C. to 250° C., thereby to accomplish the ashing treatment in an oxygen plasma.

DISCLOSURE OF THE INVENTION

With a conventional method for manufacturing a semiconductor device described in FIGS. 4A and 4B, however, since the high temperature control of a to-be-treated substrate 15 at temperatures of 150° C. to 250° C. during the ashing allows an underlying silicon substrate 11 to be etched as shown in FIG. 4C under the action of fluorine radicals generated from a fluorocarbon film 16 deposited on the surface of a to-be-treated substrate 15, a junction leakage or contact fault is liable to occur and consequently there is a problem in reliability.

It is one object of the present invention to provide a method for manufacturing a semiconductor device wherein an underlying silicon substrate and a polycrystalline silicon film are hardly subject to etching during the ashing.

Besides, with the stripping removal of a fluorocarbon film 26 by a dry etching post-treatment method as described referring to FIGS. 5 and 6, a junction leakage or variation in contact resistance was confirmed in a MOS transistor of an LDD structure and the deterioration of a gate insulating film was confirmed in a MOS transistor with the side wall film serving as an element separation insulating film.

Thus, the inventor of the present invention observed the surface of a semiconductor silicon substrate 16 in the aspect of FIG. 5D after the ashing of a fluorocarbon film 26 in the process step for manufacturing a MOS transistor of an LDD structure. As shown in FIG. 7A, the observed result confirmed the presence of etched traces 29 on the surface of a semiconductor silicon substrate 16 that had been considered not to be affected by ashing. As these etched traces 29, an about 20 nm high ruggedness was formed. On observing the aspect of high concentration diffused layers 24 and 25 formed by means of ion implantation, the diffused layers 24 and 25 were actually formed as shown in FIG. 7B.

Moreover, the inventor of the present invention observed the surface of a semiconductor silicon substrate 16 in the aspect of FIG. 6D after the ashing of a fluorocarbon film 26 in the process step for manufacturing a MOS transistor with the side wall film serving as an element separation insulating film. As shown in FIG. 8A, the observed result confirmed the presence of etched traces 30 on the surface of a semiconductor silicon substrate 16 that had been considered not to be etched. As these etched traces 30, an about 20 nm high ruggedness was formed. On observing the aspect of a gate electrode 18 formed on the transistor activated region 27 via the gate oxide film 17, the gate electrode 18 was actually formed as shown in FIG. 8B.

Another object of the present invention is to provide a dry etching post-treatment method wherein the surface of the semiconductor silicon substrate 16 is not etched in the dry etching post-treatment on the assumption that the junction leakage, variation in contact resistance and deterioration of the gate insulating film in a MOS transistor of an LDD structure with the side wall film serving as an element separation insulating film is attributed to the occurrence of etching on the surface of the semiconductor silicon substrate 16 in the dry etching post-treatment for the ashing of a fluorocarbon film 26.

A method for manufacturing a semiconductor device as claimed in claim 1 is featured by comprising the steps of: covering a predetermined portion of an insulating film on a silicon substrate or a polycrystalline silicon film with a photoresist; removing the portion of said insulating film not covered with the photoresist by dry etching using an etching gas containing carbon and fluorine; and removing a fluorocarbon film deposited on the surface of the substrate and said photoresist by ashing using at least oxygen gas while controlling the temperature at 100° C. or lower.

A method for manufacturing a semiconductor device as claimed in claim 2 is featured by comprising the steps of: covering a predetermined portion of an insulating film on a silicon substrate or a polycrystalline silicon film with a photoresist; removing the portion of said insulating film not covered with the photoresist by dry etching using an etching gas containing carbon and fluorine; removing a fluorocarbon film deposited on the surface of the substrate by ashing using at least oxygen gas while controlling the temperature at 100° C. or lower; and removing said photoresist by the ashing using at least oxygen gas while raising the temperature to any temperature of 150° C. to 250° C.

A method for manufacturing a semiconductor device as claimed in claim 3 is featured by comprising the steps of: covering a predetermined portion of an insulating film on a silicon substrate or a polycrystalline silicon film with a photoresist; removing the portion of said insulating film not covered with the photoresist by dry etching using an etching gas containing carbon and fluorine; and removing a fluorocarbon film deposited on the surface of the substrate and said photoresist by ashing using at least oxygen gas while continuously raising the temperature from 100° C. or lower.

A dry etching post-treatment method as claimed in claim 4 is featured by comprising the steps of: forming continuous insulating films of a same composition on the top and side faces of a stepped portion formed on a semiconductor silicon substrate or a polycrystalline silicon film; effecting dry etching so as to leave an insulating film only on the side face of said stepped portion by anisotropic dry etching using an etching gas containing oxygen and fluorine; and thereafter removing a fluorocarbon film deposited during said dry etching with the aid of an oxygen plasma using at least oxygen gas while controlling the temperature at 100° C. or lower and not lower than room temperature.

A method for manufacturing a MOS semiconductor device as claimed in claim 5 is featured by comprising the steps of: forming a gate electrode on a semiconductor silicon substrate or a polycrystalline silicon film via a gate insulating film; then forming a part of source and drain by introducing impurities into the semiconductor silicon substrate with said gate electrode serving as a mask; forming a continuous insulating film of a same composition on the top and side faces of said gate electrode; thereafter effecting a dry etching so as to leave the insulating film only on the side face of said stepped portion by anisotropic dry etching using an etching gas containing carbon and fluorine; then removing a fluorocarbon film deposited during said dry etching with the aide of an oxygen plasma using at least oxygen gas while controlling the temperature at 100° C. or lower and not lower than room temperature; and introducing impurities into the surface of the semiconductor silicon substrate with said gate electrode and the insulating film left on the side face thereof, both serving as a mask to form the other parts of said source and drain.

A method for manufacturing a MOS semiconductor device as claimed in claim 6 is featured by comprising the steps of: forming a first insulating film serving as a part of an element separation insulating film on a semiconductor silicon substrate or a polycrystalline silicon film, then forming a second insulating film of a same composition continuously on the top and side faces of said first insulating film; thereafter effecting a dry etching so as to leave said second insulating film on the side face of said first insulating film by anisotropic dry etching using an etching gas containing carbon and fluorine to form the element separation insulating film; removing a fluorocarbon film deposited during said dry etching with the aid of an oxygen plasma at least using oxygen gas while controlling the temperature at 100° C. or lower and at not lower than room temperature; and forming a gate electrode on an activated region of the semiconductor silicon substrate separated by said element separation insulating film via a gate insulating film.

DESCRIPTION OF THE EMBODIMENTS

Hereinafter, manufacturing methods according to the present invention will be described referring to FIGS. 1 to 3 and FIGS. 5 to 8.

Embodiment 1

Embodiment 1 according to the present invention will be described referring to FIGS. 1A to 1C.

Figure 1A:
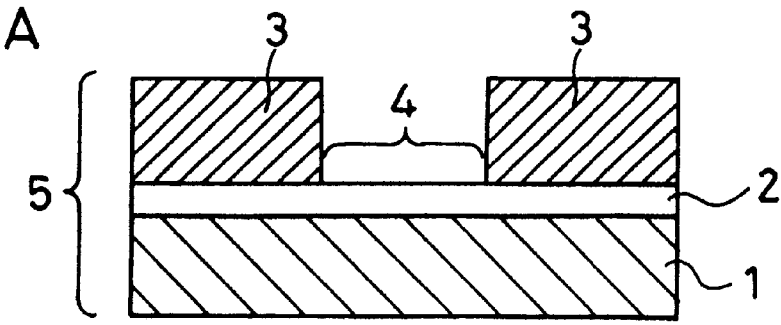
FIGS. 1A–1C are sectional views showing a manufacturing procedure according to Embodiment 1 of the present invention.
Figure 1B:
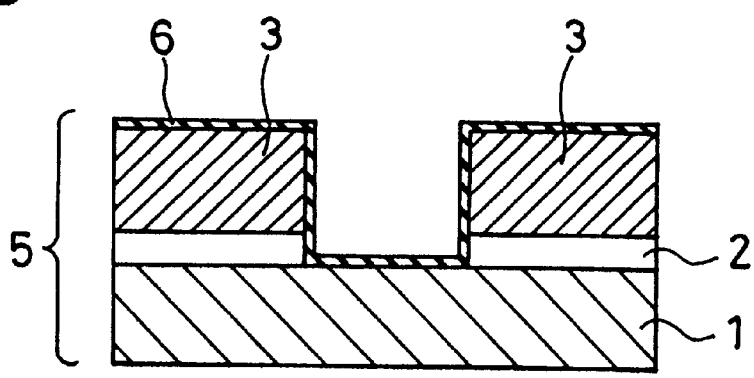

First, after a silicon oxide film (insulating film) 2 is allowed to grow on a silicon oxide substrate 1, a predetermined portion of the silicon oxide film 2 is covered with a photoresist 3 as shown in FIG. 1A. Then, a not-covered portion 4 of the silicon oxide film 2 with the photoresist 3 is removed by dry etching with a gas mixture of CF4 and CHF3 serving as an etching gas. In this embodiment, dry etching is practiced under conditions of a gas pressure of 133 pa and an RF power of 1 kW. At this time, as shown in FIG. 1B, a fluorocarbon film 6 is deposited on the surface of a to-be-treated substrate 5.

Thereafter, the fluorocarbon film 6 deposited on the surface of the photoresist 3 and the to-be-treated substrate 5 is removed by ashing employing an oxygen gas. A single wafer type ashing apparatus is used for ashing. The temperature of a stage on which the to-be-treated substrate 5 is installed is controlled at 100° C. or lower. In this embodiment, it was controlled at 80° C. After the to-be-treated substrate 5 introduced into a treating chamber, oxygen gas is introduced to generate a plasma (in this embodiment, gas pressure: 133 pa and RF power: 500 W), and the fluorocarbon film 6 deposited on the surface of the to-be-treated substrate 5 and the photoresist 3 are completely removed by ashing as shown in FIG. 1C.

Figure 1C:
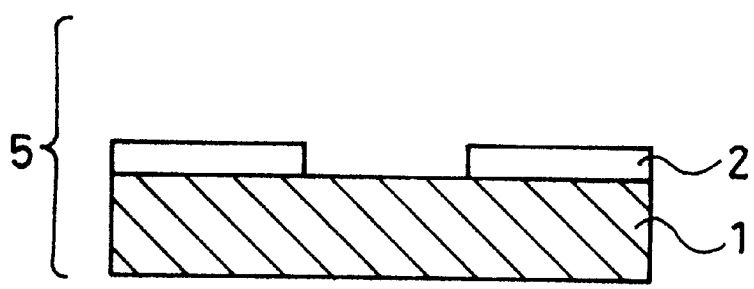

According to the method for manufacturing a semiconductor device thus composed, since the temperature of the to-be-treated substrate 5 during the ashing is controlled at 100° C. or lower, the etching speed of silicon by employing fluorine radicals generated from the fluorocarbon film 6 becomes very slow and the underlying silicon substrate 1 is hardly etched as shown in FIG. 1C. Thus, problems such as junction leakage and contact fault are eliminated and the reliability of a semiconductor device prepared employing the dry etching of the insulating film 2 can be greatly improved.

Embodiment 2

Embodiment 2 according to the present invention will be described referring to FIGS. 2A to 2D.

Figure 2A:
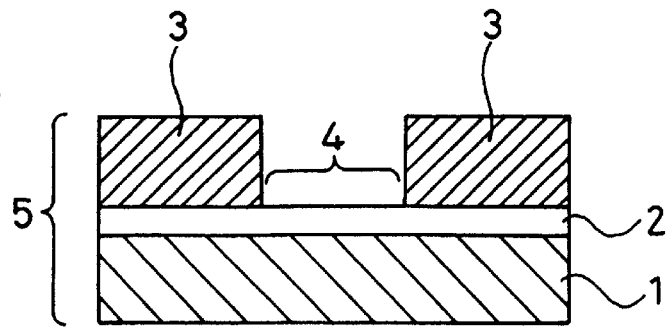
FIGS. 2A–2D are sectional views showing manufacturing procedures for explaining Embodiment 2 and Embodiment 3 of the present invention.

First, after a silicon oxide film 2 is allowed to grow on a silicon oxide substrate 1, a predetermined portion of the silicon oxide film 2 is covered with a photoresist 3 as shown in FIG. 2A.

Figure 2B:
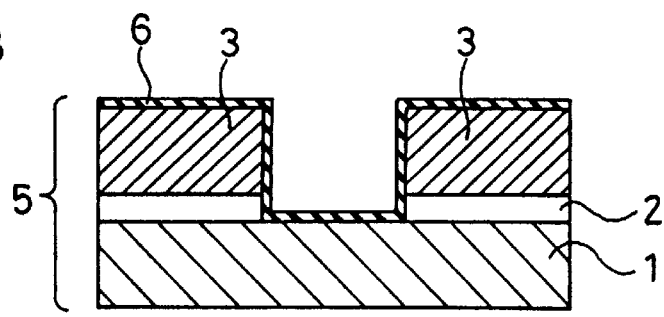
Figure 2C:
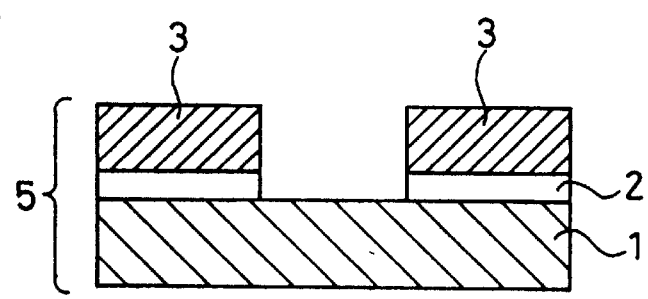

Then, after a not-covered portion 4 of the silicon oxide film 2 with the photoresist 3 is removed by dry etching with a gas mixture of CF4 and CHF3 serving as an etching gas as shown in FIG. 2B, a to-be-treated substrate 5 is introduced into a treating chamber of a sheet type ashing apparatus while controlling the temperature of a stage on which the to-be-treated substrate 5 is installed at 100° C. or lower (at 80° C. in this embodiment), an oxygen gas is introduced thereinto to completely remove a fluorocarbon film 6 left on the surface of the to-be-treated substrate 5 by ashing as shown in FIG. 2C.

Thereafter, the temperature of a stage on which the to-be-treated substrate 5 shown in FIG. 2C is installed in raised to any temperature of 150° C. to 250° C. (to 160° C. in this embodiment) and the photoresist 3 left on the to-be-treated substrate 5 is completely removed by ashing as shown in FIG. 2D.

Figure 2D:
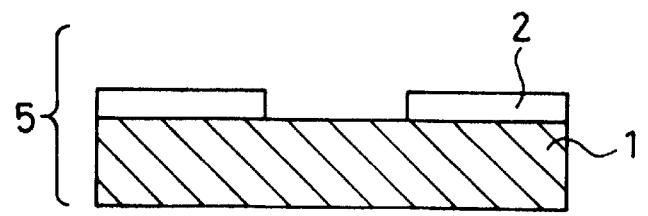

According to the method for manufacturing a semiconductor device thus composed, if the fluorocarbon film 6 left on the to-be-treated substrate 5 has been removed by ashing while the temperature of the to-be-treated substrate 5 during the ashing is controlled at 100° C. or lower, the underlying silicon substrate 1 is hardly etched as shown in FIG. 2D, even when the photoresist 3 left on the to-be-treated substrate 5 is removed by ashing at high temperatures of 150° C. to 250° C. Thus, problems such as junction leakage and contact fault are eliminated and the reliability of a semiconductor device prepared by employing the dry etching of the insulating film 2 can be greatly improved.

Besides, since the photoresist 3 can be removed at high temperatures of 150° C. to 250° C. by ashing, the ashing speed is accelerated, thereby enabling the ashing time to be shortened.

Embodiment 3

Embodiment 3 according to the present invention will be described referring to FIG. 2.

First, after a silicon oxide film 2 is allowed to grow on a silicon oxide substrate 1, a predetermined portion of the silicon oxide film 2 is covered with a photoresist 3 as shown in FIG. 2A. Then, after a not-covered portion 4 of the silicon oxide film 2 with the photoresist 3 is removed by dry etching with a gas mixture of CF4 and CHF3 serving as an etching gas, a to-be-treated substrate 5 is introduced into a treating chamber of a sheet type ashing apparatus while controlling the temperature of a stage on which the to-be-treated substrate 5 is installed at 100° C. or lower (at 80° C. in this embodiment), an oxygen gas is introduced thereinto to completely remove a fluorocarbon film 6 left on the surface of the to-be-treated substrate 5 by ashing as shown in FIG. 2C.

After the fluorocarbon film 6 deposited on the surface of the to-be-treated substrate 5 is completely removed by ashing, the ashing is discontinued. Then, the to-be-treated substrate 5 is taken out from an ashing treatment chamber and moved to another treatment chamber of the single wafer type ashing apparatus while controlling the temperature of a stage on which the to-be-treated substrate 5 is installed at 150° C. to 250° C. (at 160° C. in this embodiment) to completely remove the left photoresist 3 by ashing.

According to the method for manufacturing a semiconductor device thus composed, the same effect as with Embodiment 2 can be obtained. Furthermore, because two treatment chambers having different setup temperatures are employed, a stable ashing treatment can be carried out without need for changing the temperature in a same treatment chamber.

Embodiment 4

Embodiment 4 according to the present invention will be described referring to FIGS. 3A to 3C.

Figure 3A:
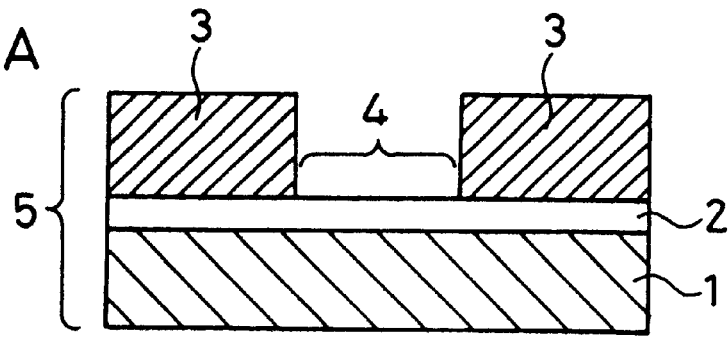
FIGS. 3A–3C are sectional views showing a manufacturing procedure for explaining Embodiment 3 of the present invention.
Figure 3B:
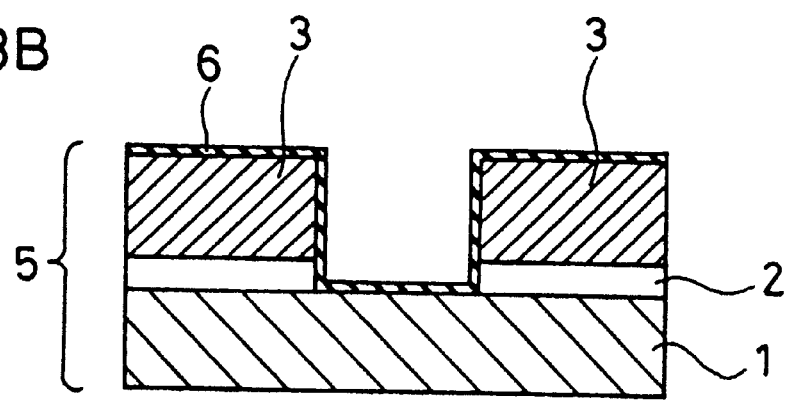
Figure 3C:
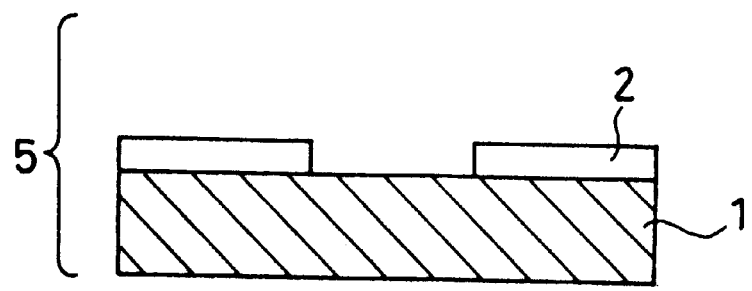
Figure 4A:
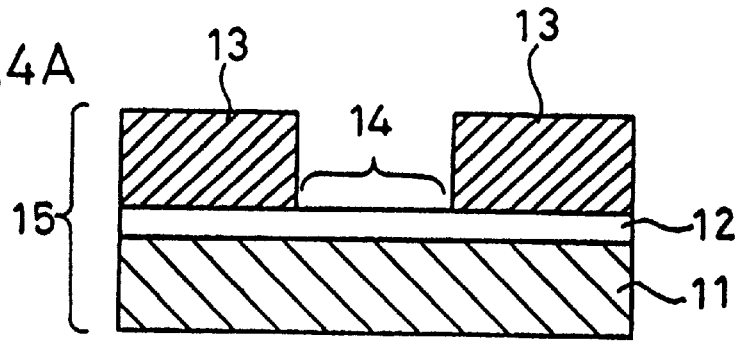
FIGS. 4A–4C are sectional views showing a manufacturing procedure for explaining a conventional ashing method.
Figure 4B:
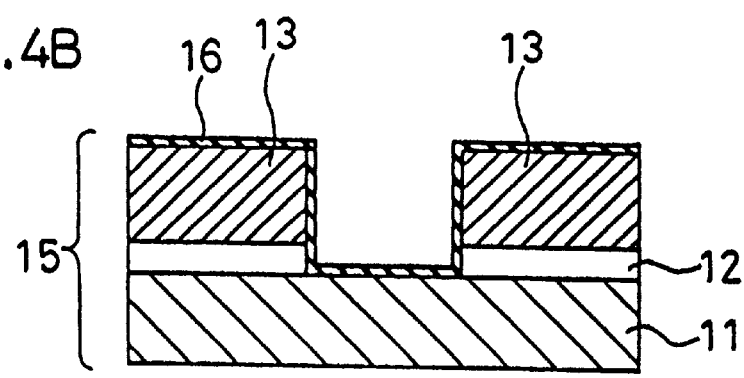
Figure 4C:
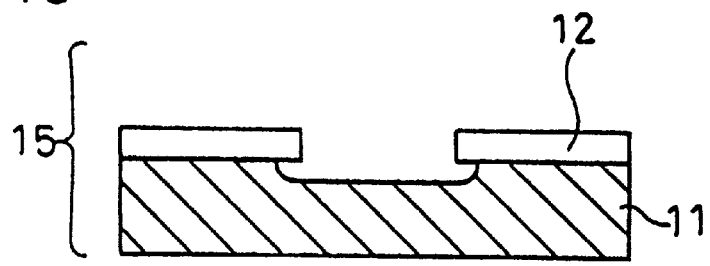

First, after a silicon oxide film 2 is allowed to grow on a silicon oxide substrate 1, a predetermined portion of the silicon oxide film 2 is covered with a photoresist 3 as shown in FIG. 3A. Then, after a not-covered portion 4 of the silicon oxide film 2 with the photoresist 3 is removed by dry etching with a gas mixture of CF4 and CHF3 serving as an etching gas. At this time, a fluorocarbon film 6 is deposited on the surface of a to-be-treated substrate 5 as shown in FIG. 3B.

Then, ashing is made by employing a barrel-shaped batch type ashing apparatus. The temperature of a treatment chamber before the start of the ashing treatment chamber is controlled at low temperatures of 50° C. to 100° C. (at 60° C. in this embodiment). After the introduction of the to-be-treated substrate 5 shown in FIG. 3B into the treatment chamber, an oxygen gas is introduced to generate a plasma. In the barrel-shaped batch type ashing apparatus, generally, with the start of ashing, the temperature of the treatment chamber rises to the range of 200° C. to 250° C. (rose to 230° C. in this embodiment) owing to the reaction heat between oxygen and the photoresist 3. In this manner, the fluorocarbon film 6 and the photoresist 3 are removed by ashing as shown in FIG. 3C.

According to the method for manufacturing a semiconductor device thus composed, since the temperature of the treatment chamber before start of the treatment is controlled at low temperatures of 50° C. to 100° C., the fluorocarbon film 6 deposited can be removed at low temperatures and thereafter, since the temperature of the treatment chamber rises to the range of 200° C. to 250° C., the remaining photoresist 3 can be removed at high temperatures by ashing. For this reason, the underlying silicon substrate 1 is hardly etched as shown in FIG. 3C, so that problems such as junction leakage and contact fault are eliminated and a drastic improvement in the reliability of a semiconductor device prepared employing the dry etching of the insulating film 2 can be implemented. Furthermore, the ashing rate increases, thereby enabling the ashing time to be shortened.

Incidentally, cases of employing a silicon substrate 1 are shown in the embodiments mentioned above, but a similar effect can be observed even in cases of employing a polycrystalline silicon film. Besides, a silicon oxide film is employed as the insulating film 2, but a silicon nitride film or the like may be employed. And, cases where an oxygen gas is employed for an ashing gas are shown, but a similar effect can be obtained even in cases where employed is a gas mixture made by adding nitrogen gas, CF4 gas, CHF3 gas or the like to oxygen gas. Also shown are the cases where a gas mixture of CF4 and CHF3 is employed as a dry etching gas for an insulating film 2, but a similar effect can be obtained even with any gas mixture comprising carbon and fluorine.

Embodiment 5

The process for forming a MOS transistor of an LDD structure with a dry etching post-treatment method according to the present invention is composed as follows.

Figure 5A:
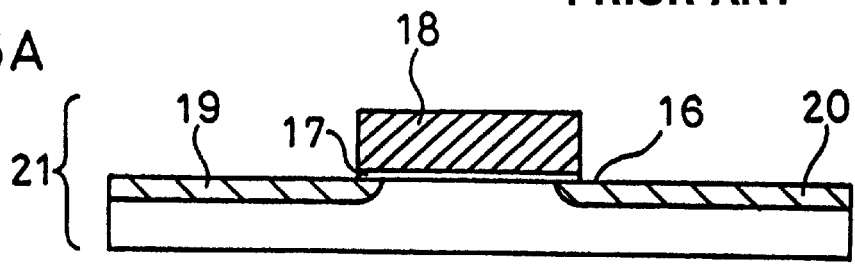
FIGS. 5A–5E are sectional views showing an ideal manufacturing procedure of a MOS transistor of LDD structure.
Figure 5B:
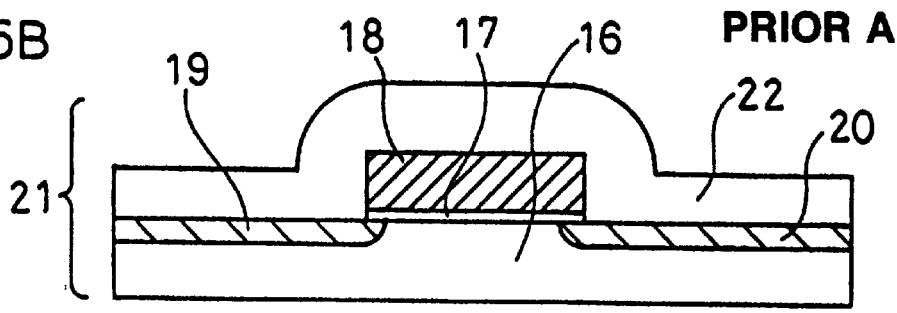
Figure 5C:
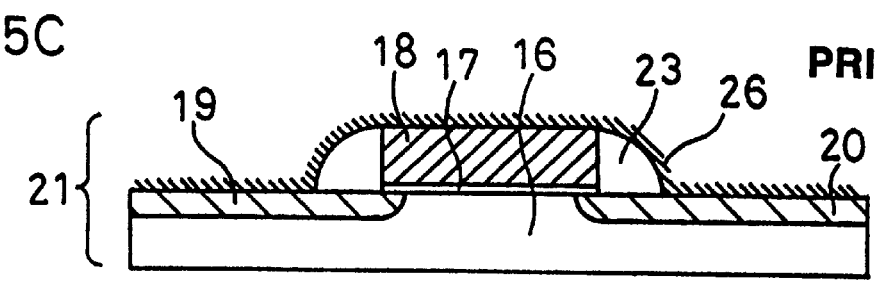
Figure 5D:
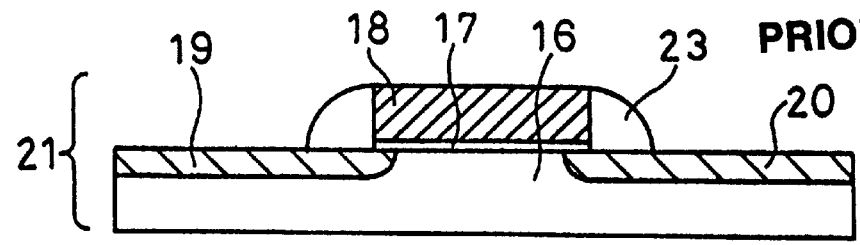
Figure 5E:
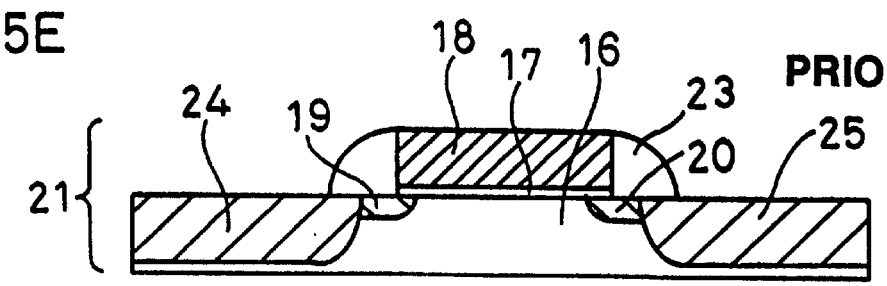
Figure 7A:
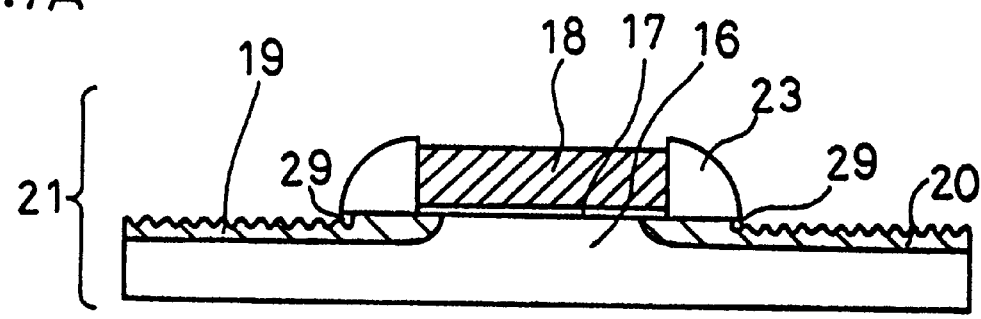
FIGS. 7A–7B are sectional views showing actual aspects after a dry etching post-treatment procedure of a MOS transistor of an LDD structure.
Figure 7B:
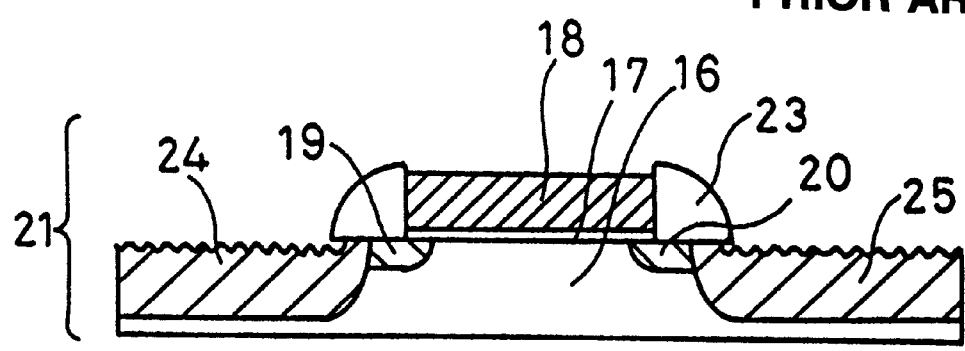

Incidentally, a conventional process for forming a MOS transistor of an LDD structure comprises FIGS. 5A through 5B, 5C and 7A, 7B, but according to Embodiment 5, it can be confirmed that the adoption of a dry etching post-treatment method according to the present invention permits the dry etching post-treatment and the subsequent steps to comprise FIGS. 5D and 5E, but not FIGS. 7A and 7B.

To be specific, as shown in FIG. 5A, a gate electrode 18 comprising an about 300 nm thick polycrystalline silicon film is formed on a p-type semiconductor silicon substrate 16 via a 20 nm gate oxide film 17 by using the well-known photolithography and dry etching techniques. Next, with the gate electrode 3 serving as a mask, N-type diffused layers 19 and 20 of a low impurity concentration constituting part of source and drain are formed in a self-alignment manner by means of ion implantation (P+ impurities were employed at 40 keV and $5 \times 10^{13}$ number/cm$^2$ in this embodiment).

Next, as shown in FIG. 5B, a silicon oxide film 22 is allowed to grow for about 250 nm by the CVD so as to cover the surface of the to-be-treated substrate 21. Then, by anisotropic dry etching with a gas mixture of CF4 and CHF3 serving as an etching gas, the silicon oxide film 22 is removed so as to leave only the side face of the gate electrode 18, thereby forming a side wall film 23.

In this embodiment, the dry etching was performed on condition that the gas pressure is 133 pa and the RF power is 1 kW. At that time, a fluorocarbon film 26 is deposited on the surface of the to-be-treated substrate 21 as shown in FIG. 5C.

Thereafter, the fluorocarbon film 26 deposited on the surface of the to-be-treated substrate 21 is removed by the oxygen plasma treatment. For the oxygen plasma treatment, a single wafer type apparatus was employed. The temperature of a stage on which the to-be-treated substrate 21 is installed is controlled at 100° C. or lower. The effect of the present invention becomes significant at 100° C. or lower and the temperature was set at 80° C. in this embodiment.

After the introduction of the to-be-treated substrate 21 into a treatment chamber, oxygen gas is introduced to generate a plasma (specifically, gas pressure: 133 pa and RF power: 500 W), thus accomplishing the removal of a fluorocarbon film 26 deposited on the surface of the to-be-treated substrate 21.

The fluorocarbon film 26 thus deposited was 10–20 nm thick. On executing a 15-seconds dry etching post-treatment, only the fluorocarbon film 26 deposited on the surface of the to-be-treated substrate 21 can be completely removed as shown in FIG. 5D.

Though the dry etching post-treatment was also carried out for more than 15 seconds, no etching of the surface of the semiconductor silicon substrate 16 was noticed after the complete removal of the fluorocarbon film 26 and the surface of the semiconductor silicon substrate 16 was smooth as shown in FIG. 5D.

In this manner, it can be inferred that, since the temperature of the to-be-treated substrate 21 during the oxygen plasma treatment was controlled at a low temperature of 100° C. or lower, the silicon etching speed with fluorine radicals generated from the fluorocarbon film 26 became very slow and the underlying semiconductor substrate 16 was hardly etched as shown in FIG. 5D.

Thereafter, as shown in FIG. 5E, N-type diffused layers 24 and 25 of a high impurity concentration constituting the other part of the above source and drain were formed in a self-alignment manner, with the above gate electrode 18 and side wall film 23 serving as a mask, by means of ion implantation (specifically, As+ impurities employed at 20 keV and $5\times10^{15}$ number/cm$^2$) to prepare a MOS transistor of an LDD structure.

On measuring the characteristics of the prepared MOS transistor, good characteristics free of junction leakage, variation in contact resistance and the like were obtained.

With Embodiment 5, a 15-seconds dry etching post-treatment was made at 80° C., but even if the post-treatment is carried out with the temperature of the to-be-treated substrate 21 kept at a room temperature (24° C.), the treatment time prolongs a little for a complete removal of the fluorocarbon film 26 as compared with the case of 80° C., and yet a similar result is obtained. In order to simplify the temperature control of the to-be-treated substrate 21, it is preferable to control the temperature of the to-be-treated substrate 21 during the dry etching post-treatment at 100° C. or lower and above a room temperature.

Embodiment 6

Whereas one example of process for forming a MOS transistor of an LDD structure is shown in Embodiment 5, Embodiment 6 shows one example of process for forming an element separation insulating film utilizing a side wall film.

Figure 6A:
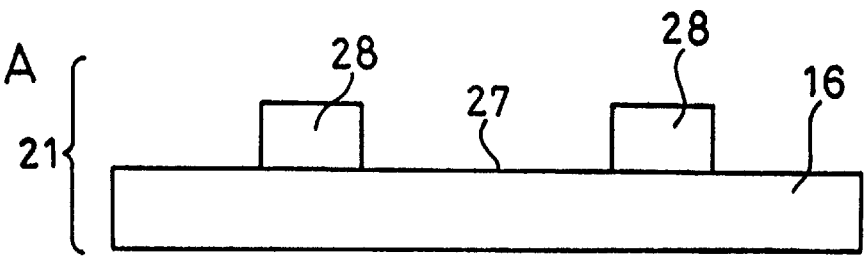
FIGS. 6A–6E are sectional views showing an ideal manufacturing procedure of a MOS transistor with a side wall film utilized for an element separation insulating film.
Figure 6B:
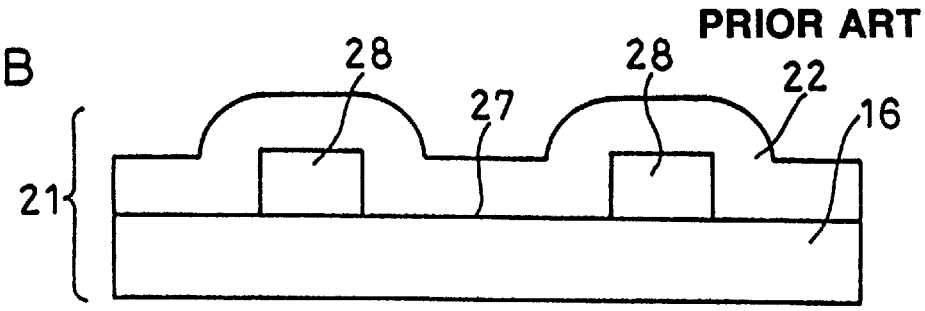
Figure 6C:
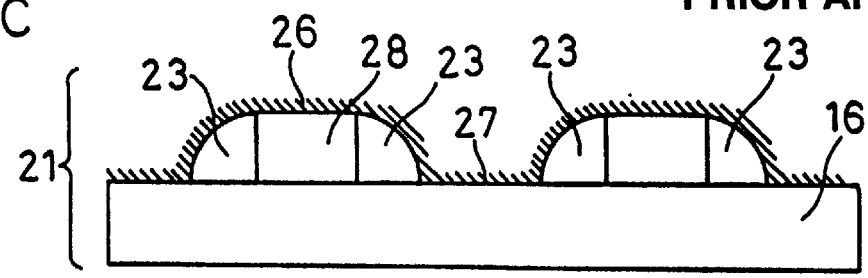
Figure 6D:
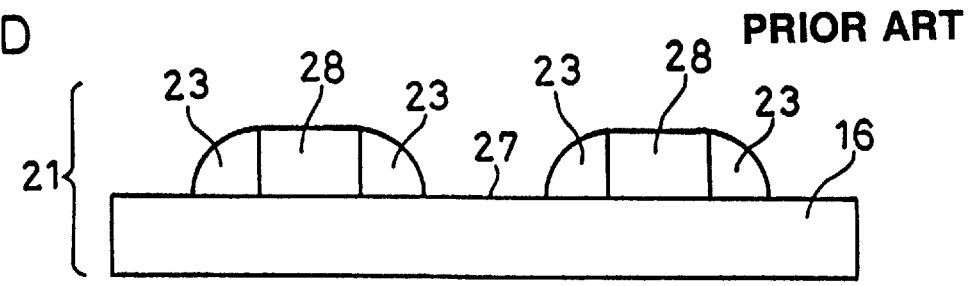
Figure 6E:
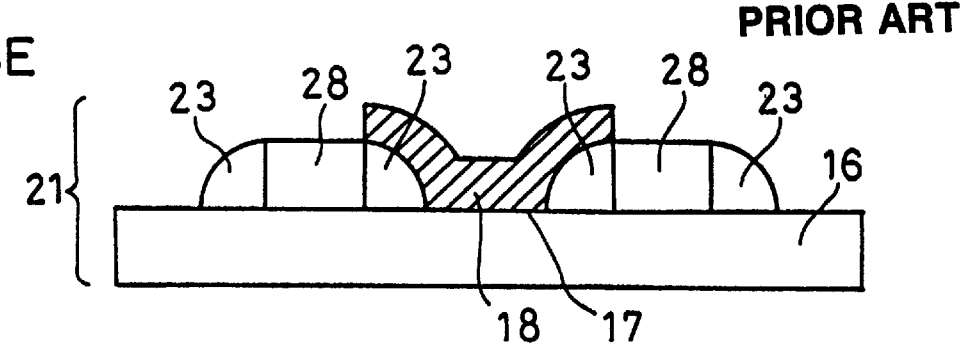
Figure 8A:
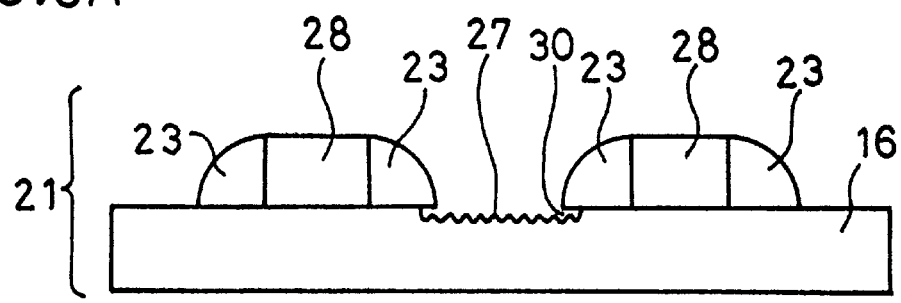
FIGS. 8A–8B are sectional views showing actual aspects after a dry etching post-treatment procedure of a MOS transistor with a side wall film utilized for an element separation insulating film.
Figure 8B:
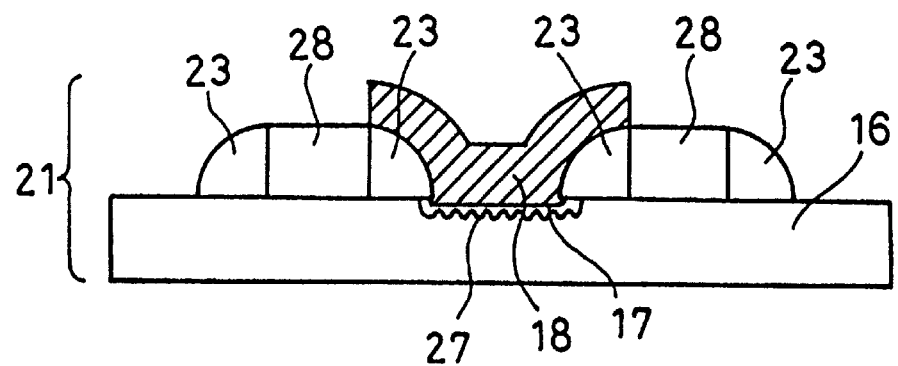

Incidentally, a conventional process for forming an element separation insulating film utilizing a side wall film comprises FIGS. 6A through 6B, 6C, but with Embodiment 6, it can be confirmed that the adoption of a dry etching post-treatment method according to the present invention permits the dry etching post-treatment and the subsequent steps to comprise the aspects of FIGS. 6D and 6E, but not those of FIGS. 8A and 8B.

To be specific, as shown in FIG. 6A, an insulating film 28 constituting part of the insulating film for separating a transistor activated region 27 is formed on a P-type semiconductor silicon substrate 16 by using the well-known photolithography and dry etching techniques.

Next, as shown in FIG. 6B, a 200 nm thick silicon oxide film 22 is deposited on the to-be-treated substrate 21 by the CVD.

Then, by an anisotropic dry etching with a gas mixture of CF4 and CHF3 serving as an etching gas, the silicon oxide film 22 is removed so as to leave only the side face of the insulating film 28, thereby forming a side wall film 23.

In this embodiment, dry etching was performed on the condition that the gas pressure is 133 pa and the RF power is 1 kW. At this time, a fluorocarbon film 26 is deposited on the surface of the to-be-treated substrate 21 as shown in FIG. 6C.

Thereafter, the fluorocarbon film 26 deposited on the surface of the to-be-treated substrate 21 is removed by the oxygen plasma treatment. For the oxygen plasma treatment, a single wafer type apparatus was employed. The temperature of a stage on which the to-be-treated substrate 21 is installed is controlled at 100° C. or lower. The effect of the present invention becomes significant at 100° C. or lower, and the temperature was set at 80° C. in this embodiment.

After the introduction of the to-be-treated substrate 21 into a treatment chamber, an oxygen gas is introduced to generate a plasma (specifically, gas pressure: 133 pa and RF power: 500 W), thus accomplishing the removal of the fluorocarbon film 26 deposited on the surface of the to-be-treated substrate 21.

The fluorocarbon film 26 thus deposited was 10–20 nm thick. On executing a 15-seconds dry etching post-treatment, only the fluorocarbon film 26 deposited on the surface of the to-be-treated substrate 21 can be completely removed as shown in FIG. 6D.

Though the dry etching post-treatment was also carried out for more than 15 seconds, no etching of the surface of the semiconductor silicon substrate 16 was noticed after the complete removal of the fluorocarbon film 26 and the surface of the semiconductor silicon substrate 16 was smooth as shown in FIG. 6D.

In this manner, it can be inferred that, since the temperature of the to-be-treated substrate 21 during the oxygen plasma treatment was controlled at a low temperature of 100° C. or lower, the silicon etching speed with fluorine radicals generated from the fluorocarbon film 26 became very slow and the underlying semiconductor silicon substrate 16 was hardly etched as shown in FIG. 6D.

Thereafter, on the transistor activated region 27 via a 20 nm gate oxide film 17, a gate electrode 18 comprising an about 300 nm thick polycrystalline silicon film is formed by using the well-known photolithography and dry etching techniques to prepare a MOS transistor.

On measuring the characteristic of the prepared MOS transistor, a good characteristic free of deterioration of a gate insulating film was obtained.

With Embodiment 6, a 15-seconds dry etching post-treatment was made at 80° C., but even if the post-treatment is carried out with the temperature of the to-be-treated substrate 21 kept at a room temperature (24° C.), the treatment time prolongs a little for a complete removal of the fluorocarbon film 26 as compared with the case of 80° C., and yet a similar result is obtained. In order to simplify the temperature control of the to-be-treated substrate 21, it is preferable to control the temperature of the to-be-treated substrate 21 during the dry etching post-treatment at 100° C. or lower and above the room temperature.

In all the above embodiments, examples of employing an oxygen gas alone as an oxygen plasma treatment gas are shown, but needless to say, a similar effect can be obtained even in cases of employing a gas mixture made by adding nitrogen gas, CF4 gas, CHF3 gas or the like to oxygen gas.

In all the above embodiments, examples of employing a gas mixture of CF4 and CHF3 as the dry etching gas for an insulating film are shown, but needless to say, a similar effect can be obtained even with any gas mixture comprising carbon and fluorine.

In all the above embodiments, examples of employing a semiconductor silicon substrate are shown, but needless to say, a similar effect can be observed even in cases of employing a polycrystalline silicon film.

As is obvious from all the embodiments mentioned above, according to arrangements as claimed in individual claims of the present invention, the following noticeable effects are obtained.

According to a method for manufacturing a semiconductor device as claimed in claim 1, since a predetermined portion of an insulating film on the silicon substrate or a polycrystalline silicon film is covered with a photoresist, the portion of the insulating film not covered with the photoresist is removed by the dry etching employing an etching gas containing carbon and fluorine and a fluorocarbon film deposited and said photoresist are removed by the ashing employing at least oxygen gas while controlling the temperature at 100° C. or lower, the temperature control of the substrate 5 during the ashing at a low temperature of 100° C. or lower decelerates the silicon etching speed under the action of fluorine radicals generated from the fluorocarbon film 6 to a great extent, so that the underlying silicon substrate or polycrystalline silicon becomes less subject to etching.

According to a method for manufacturing a semiconductor device as claimed in claim 2, since a predetermined portion of an insulating film on the silicon substrate or a polycrystalline silicon film is covered with a photoresist, the portion of the insulating film not covered with the photoresist is removed by the dry etching employing an etching gas containing carbon and fluorine, a fluorocarbon film deposited is removed by ashing employing at least an oxygen gas while controlling the temperature at 100° C. or lower and the photoresist is removed by ashing employing at least an oxygen gas after raising the temperature to any temperature from 150° C. to 250° C., the temperature control of the substrate 5 during the ashing at a low temperature of 100° C. or lower decelerates the silicon etching speed under the action of fluorine radicals generated from the fluorocarbon film to a great extent, so that the underlying silicon substrate or the polycrystalline silicon film becomes less subject to etching. Besides, the photoresist 3 can be removed at a high temperature from 150° C. to 250° C. by ashing, so that the ashing rate is accelerated, thereby enabling the ashing time to be shortened.

According to a method for manufacturing a semiconductor device as claimed in claim 3, since a predetermined portion of an insulating film on a silicon substrate or a polycrystalline silicon film is covered with a photoresist, the portion of the insulating film not covered with the photoresist is removed by dry etching employing an etching gas containing carbon and fluorine and a fluorocarbon film deposited and the photoresist is removed by ashing employing at least oxygen gas while continuously raising the temperature from 100° C. or lower, the temperature control of the substrate 5 during the ashing at low temperatures of 100° C. or lower decelerates the silicon etching rate under the action of fluorine radicals generated from the fluorocarbon film 6 to a great extent, so that the underlying silicon substrate or polycrystalline silicon film becomes less subject to etching. Besides, a continuous rise in the temperature of the to-be-treated substrate 5 permits the photoresist to be removed at high temperatures by ashing, so that the ashing rate is accelerated, thereby enabling the ashing time to be shortened.

According to a dry etching post-treatment method as claimed in claim 4, since continuous insulating films of a same composition are formed on the top face and the side face of a stepped portion formed on a semiconductor silicon substrate or a polycrystalline silicon film, dry etching is carried out so as to leave an insulating film only on side face of said stepped portion by anisotropic dry etching employing an etching gas containing carbon and fluorine and thereafter the fluorocarbon film deposited during the dry etching is removed at least with the aid of an oxygen plasma employing oxygen while controlling the temperature at 100° C. or lower and not lower than a room temperature, the etching rate of the underlying surface under the action of fluorine radicals generated from the fluorocarbon film 6 can be decelerated to a great extent, the fluorocarbon film is completely removed only by establishing the dry etching post-treatment period longer than an appropriate length of time without accurately controlling the termination timing of the dry etching post-treatment and moreover the underlying surface can be smoothed. Thus, a problem such as junction leakage or variation in contact resistance, e.g., in a MOS transistor of an LDD structure or a problem such as deterioration of a gate insulating film, e.g, in a MOS transistor with the side wall film serving as an element separation insulating film is eliminated, so that a drastic improvement in the reliability of a semiconductor device employing the side wall film can be implemented.

Furthermore, according to a method for manufacturing a MOS semiconductor device as claimed in claim 5 or 6, a highly reliable MOS semiconductor device is obtained.

I claim:

1. A method for manufacturing a semiconductor device comprising the steps of:

covering a portion of an insulating film on a silicon substrate or a polycrystalline silicon film with a photoresist;

removing the portion of said insulating film not covered with the photoresist by dry etching using an etching gas containing carbon and fluorine; and removing a fluorocarbon film deposited on the surface of the substrate and said photoresist by ashing using at least an oxygen gas while controlling the temperature at 100° C. or lower.

2. A method for manufacturing a semiconductor device comprising the steps of:

covering a portion of an insulating film on a silicon substrate or a polycrystalline silicon film with a photoresist;

removing the portion of said insulating film not covered with the photoresist by dry etching using an etching gas containing carbon and fluorine;

removing a fluorocarbon film deposited on the surface of the substrate by ashing using at least an oxygen gas while controlling the temperature at 100° C. or lower; and removing said photoresist by ashing using at least an oxygen gas while raising the temperature to any temperature of 150° C. to 250° C.

3. A method for manufacturing a semiconductor device comprising the steps of:

covering a portion of an insulating film on a silicon substrate or a polycrystalline silicon film with a photoresist;

removing the portion of said insulating film not covered with the photoresist by dry etching using an etching gas containing carbon and fluorine; and removing a fluorocarbon film deposited on the surface of the substrate and said photoresist by ashing using at least an oxygen gas while continuously raising the temperature from 100° C. or lower.

4. A dry etching post-treatment method comprising the steps of:

forming continuous insulating films of a same composition on the top and side faces of a stepped portion formed on a semiconductor silicon substrate or a polycrystalline silicon film;

effecting dry etching so as to leave an insulating film only on the side face of said stepped portion by anisotropic dry etching using an etching gas containing oxygen and fluorine; and thereafter removing a fluorocarbon film deposited during said dry etching with the aid of an oxygen plasma using at least an oxygen gas while controlling the temperature at 100° C. or lower and not lower than a room temperature.

5. A method for manufacturing a MOS semiconductor device comprising the steps of:

forming a gate electrode on a semiconductor silicon substrate or a polycrystalline silicon film via a gate insulating film; then forming a part of source and drain by introducing impurities into the semiconductor silicon substrate with said gate electrode serving as a mask;

forming a continuous insulating film of a same composition on the top and side faces of said gate electrode; thereafter effecting dry etching so as to leave the insulating film only on the side face of said stepped portion by anisotropic dry etching using an etching gas containing carbon and fluorine; thereafter removing a fluorocarbon film deposited during said dry etching with the aid of an oxygen plasma using at least an oxygen gas while controlling the temperature at 100° C. or lower and not lower than a room temperature; and introducing impurities into the surface of the semiconductor silicon substrate with said gate electrode and the insulating film left on the side face thereof, both serving as a mask to form the other parts of said source and drain.

6. A method for manufacturing a MOS semiconductor device comprising the steps of:

forming a first insulating film serving as a part of an element separation insulating film on a semiconductor silicon substrate or a polycrystalline silicon film; then forming a second insulating film of a same composition continuously on the top and side faces of said first insulating film; thereafter effecting a dry etching so as to leave said second insulating film on the side face of said first insulating film by anisotropic dry etching using an etching gas containing carbon and fluorine to form the element separation insulating film;

removing a fluorocarbon film deposited during said dry etching with the aid of an oxygen plasma using at least an oxygen gas while controlling the temperature at 100° C. or lower and not lower than a room temperature; and forming a gate electrode on an activated region of the semiconductor silicon substrate separated by said element separation insulating film via a gate insulating film.

* * * * *